(12) United States Patent
Kao

(10) Patent No.: US 8,722,509 B2
(45) Date of Patent: May 13, 2014

(54) METHOD OF FORMING TRENCH ISOLATION

(75) Inventor: Ching-Hung Kao, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 360 days.

(21) Appl. No.: 13/204,072

(22) Filed: Aug. 5, 2011

(65) Prior Publication Data

US 2013/0034949 A1 Feb. 7, 2013

(51) Int. Cl.
*H01L 21/76* (2006.01)
*H01L 21/302* (2006.01)

(52) U.S. Cl.
USPC .......................... 438/424; 438/427; 438/691

(58) Field of Classification Search
USPC .................. 438/404, 424, 427, 435, 691, 740
See application file for complete search history.

(56) References Cited

U.S. PATENT DOCUMENTS

| 5,893,744 | A  | * | 4/1999  | Wang ............................ 438/401 |
| 7,547,573 | B2 | * | 6/2009  | Wen et al. ...................... 438/69 |
| 2002/0076900 | A1 | * | 6/2002 | Park et al. ..................... 438/424 |
| 2004/0058508 | A1 |   | 3/2004  | Parat et al. |
| 2006/0180885 | A1 |   | 8/2006  | Rhodes |
| 2006/0258042 | A1 |   | 11/2006 | Roy et al. |
| 2007/0187734 | A1 |   | 8/2007  | Adkisson et al. |

\* cited by examiner

*Primary Examiner* — Hsien Ming Lee
(74) *Attorney, Agent, or Firm* — WPAT, PC; Justin King

(57) ABSTRACT

A method of forming trench isolation with different depths of a semiconductor device is disclosed. A semiconductor substrate having a first mask layer formed thereon is first provided. A first etching process is performed with the first mask layer as an etching mask to form a shallow trench structure, followed by forming a first dielectric layer on the semiconductor substrate to fill the shallow trench structure. The first dielectric layer is then patterned to form a second mask layer which is used in a second etching process to form a deep trench structure. After that, a dielectric material is applied to fill the deep trench structure.

15 Claims, 4 Drawing Sheets

METHOD OF FORMING TRENCH ISOLATION

BACKGROUND OF INVENTION

1. Field of the Invention

The present invention relates to a method of forming trench isolation, and more particularly, to a method of forming both shallow trench isolation and deep trench isolation of a semiconductor device.

2. Description of the Prior Art

Semiconductor manufacturing process involves a series of processes for forming and configuring structures of electronic elements in and on a semiconductor substrate. Each of these electronic elements, such as MOS transistors, must be electrically isolated from the others in order to avoid shorting the circuits.

A variety of techniques have been developed to prevent these electronic elements from interfering with each other. Among these techniques, trench isolation has been most commonly used in semiconductor manufacturing. Typically, different depths of the trench isolation are required according to the properties of the isolated electronic elements. For example, shallow trench isolation (STI) is capable of isolating the MOS transistors in a peripheral area or logic area. On the other hand, deep trench isolation (DTI) is required for high voltage elements or sensing elements. Thus, shallow trenches and deep trenches are often required to be formed in a semiconductor device.

Trench isolation structures are typically formed by steps of mask patterning, trench etching, trench filling, and planarization. As for the trench isolation structures with different depths, a conventional method is simply separating the formation of STI structures and DTI structures into two sequential processes. In other words, the aforementioned steps repeat twice to form the STI and DTI respectively, leading to a lengthy and inefficient fabrication process. Accordingly, there is a strong need in the art for alternate methods of forming both STI and DTI of a semiconductor device.

SUMMARY OF INVENTION

It is therefore a primary objective of the present invention to provide a method of forming trench isolation with different depths of a semiconductor device to solve problems mentioned above.

In one aspect of the present invention, a semiconductor substrate having a first mask layer formed thereon is first provided. A first etching process is performed with the first mask layer as an etching mask to form a shallow trench structure, followed by forming a first dielectric layer on the semiconductor substrate to fill the shallow trench structure. The first dielectric layer is then patterned to form a second mask layer which is used in a second etching process to form a deep trench structure. After that, a dielectric material is applied to fill the deep trench structure.

According to another aspect of the present invention, a method of forming trenches in a semiconductor substrate is disclosed. A semiconductor substrate having a first area and a second area adjacent to the first area is first provided. A first dielectric layer is formed on the semiconductor substrate. The first dielectric layer is then patterned to form a first mask layer. A first etching process is followed to form a plurality of first trenches having a first depth in the first area of the semiconductor substrate. After that, a second dielectric layer covering the first area and the second area while filling the first trenches is formed on the semiconductor substrate. The second dielectric layer is patterned to form a second mask and used in a followed second etching process to form a plurality of second trenches having a second depth different from the first depth.

This and other objectives of the present invention will no doubt become obvious to those of ordinary skill in the art after having read the following detailed description of the preferred embodiment which is illustrated in the various figures and drawings.

DETAILED DESCRIPTION

Please refer to FIG. 1 to FIG. 5, which are schematic diagrams of a method of forming trench isolation structures of a semiconductor device 100 according to a first embodiment of the present invention.

Figure 1:
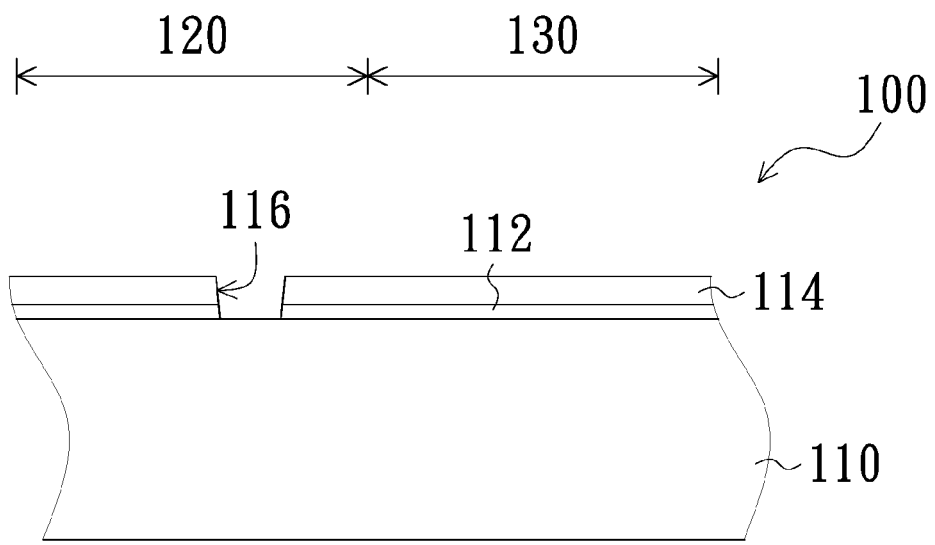
FIG. 1 to FIG. 5 are schematic diagrams illustrating a method of forming trench isolation structures of a semiconductor device 100 according to a first embodiment of the present invention.

As shown in FIG. 1, the semiconductor device 100 comprises a semiconductor substrate 110, which has a first area 120 and a second area 130 defined thereon. A pad layer 112 and a first mask layer 114 having a plurality of first openings 116 in the first area 120 are formed on the semiconductor substrate 110 in sequence. It is noted that only one first opening 116 is illustrated in FIG. 1 for clarity, while a plurality of first openings 116 are formed in practice. In an embodiment of the invention, the pad layer 112 is a pad oxide layer and the first mask layer 114 is a silicon nitride layer.

Figure 2:
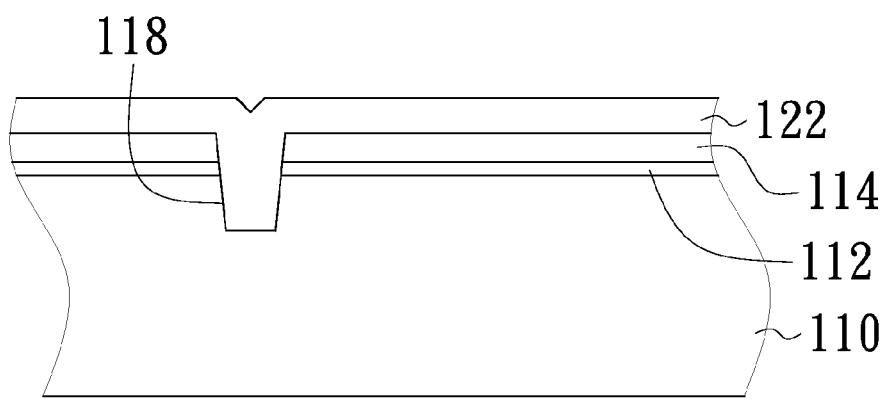

As shown in FIG. 2, a first etching process is performed by using the first mask layer 114 as an etching mask to form a shallow trench structure 118 corresponding to the first opening 116. A first dielectric material is applied to fill the shallow trench structure 118 and to form a first dielectric layer 122 on the semiconductor substrate 110.

In an embodiment of the invention, the first dielectric layer 122 is a silicon oxide layer. The shallow trench structure 118 has a depth in a range of 2000 to 4000 angstroms. In another embodiment of the present invention, an additional first liner layer (not shown) is formed inside the shallow trench structure 118, coating the inner wall of the shallow trench structure 118, before applying the first dielectric material.

Figure 3:
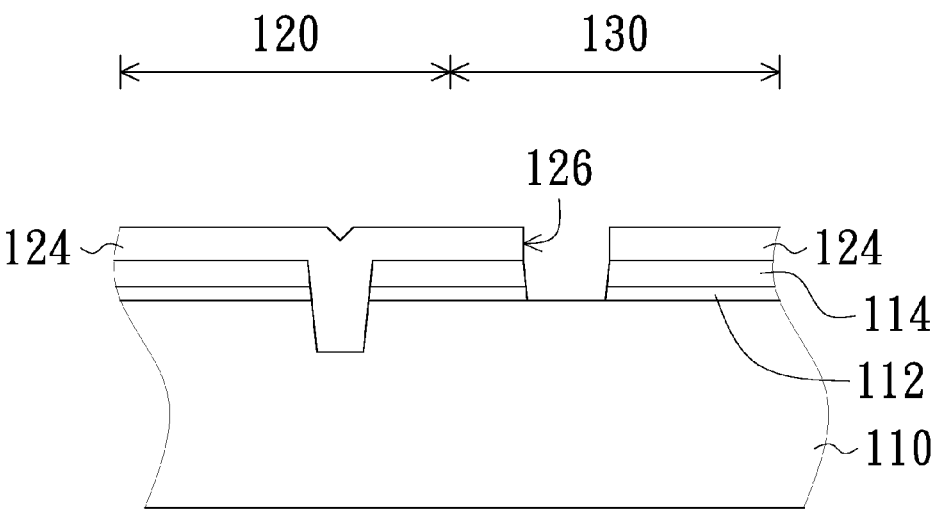

As shown in FIG. 3, after the first dielectric layer 122 is formed, a photolithography process is performed to pattern the first dielectric layer 122 so as to form a second mask layer 124 having a plurality of second openings 126 in the second area 130. For clarifying, only one second opening 126 is illustrated in FIG. 3.

Figure 4:
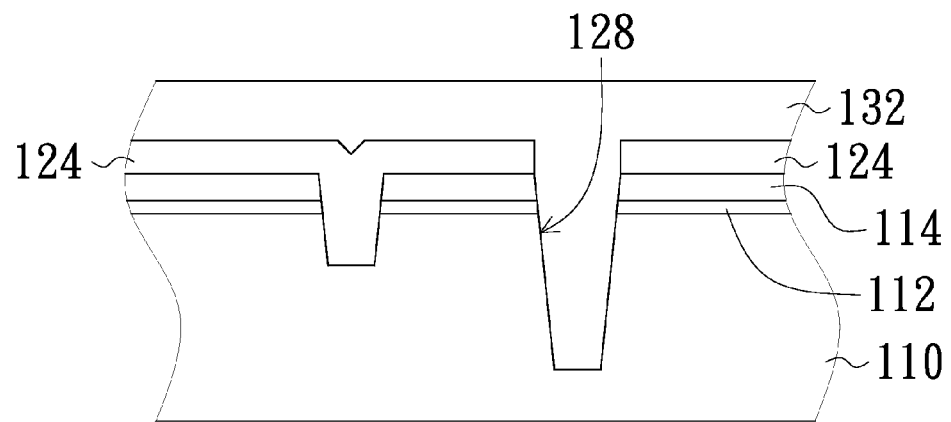

As shown in FIG. 4, a second etching process is then performed with the second mask layer 124 to form a plurality of deep trench structures 128 corresponding to the plurality of second openings 126 respectively. A second dielectric material is applied to fill the deep trench structure 128 and to form a second dielectric layer 132 on the semiconductor substrate 110.

In an embodiment of the invention, the second dielectric layer 132 is a silicon oxide layer. The deep trench structure 128 has a depth in a range of 20000 to 40000 angstroms. In another embodiment of the present invention, an additional second liner layer (not shown) is formed inside the deep trench structure 128, covering the inner wall of the deep trench structure 128, before applying the second dielectric material to fill the deep trench structure 128.

Figure 5:
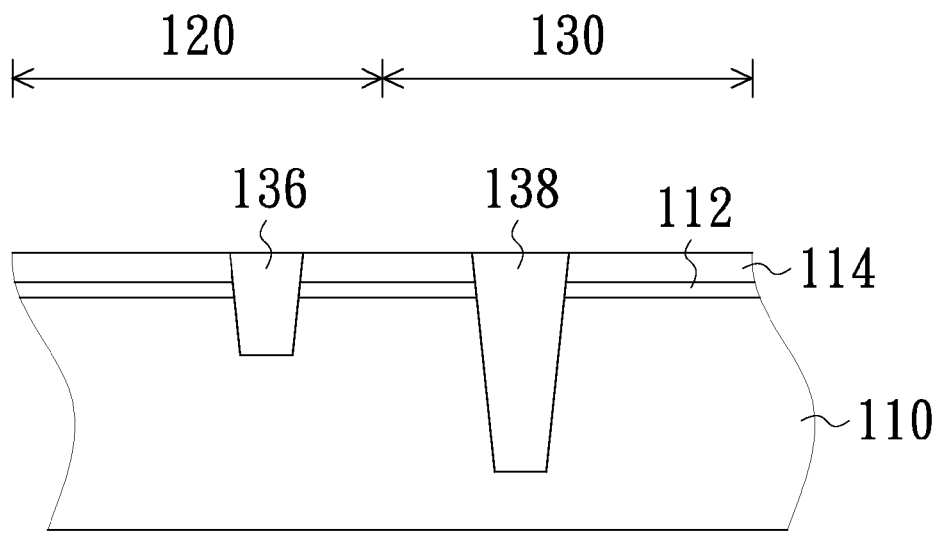

As shown in FIG. 5, after the second dielectric layer 132 is formed, a thermal process is performed for densification and a chemical mechanical polishing (CMP) process is then performed for planarization. Since the shallow trench structures 126 and the deep trench structures 128 are all formed and filled previously in the first area 120 and the second area 130, respectively, the applying force of the CMP process supposed to be high in the second area 130 can be lowered, while leading to a better quality of planarization.

Figure 6:
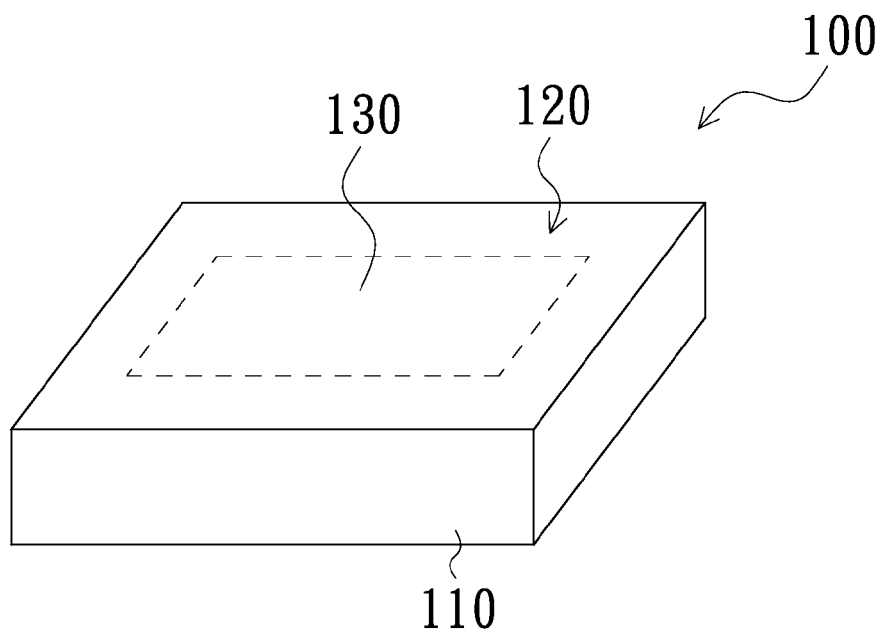
FIG. 6 is a schematic diagram of the semiconductor device 100.

Please refer to FIG. 6, which is a schematic diagram of the semiconductor device 100. As shown in FIG. 6, the second area 130 is surrounded by the first area 120. In an embodiment of the present invention, the first area 120 is a logic region where a logic circuit is to be formed. The STI structures 136 are used to isolate logic devices of the logic circuit in the first area 120. Correspondingly, the second area 130 is a pixel region where a sensing circuit is to be formed. The DTI structures 138 are configured to isolate sensor devices of the sensing circuit in the second area 130.

In another embodiment of the present invention, a plurality of high voltage devices are formed in the second area 130, and the DTI structures 138 are configured to isolate these high voltage devices in the second area 130.

According to the FIG. 1 to FIG. 6, a method of forming trenches with different depths in a semiconductor substrate is disclosed. It is noted that the method can be adjusted according to requirements of product design.

Figure 7:
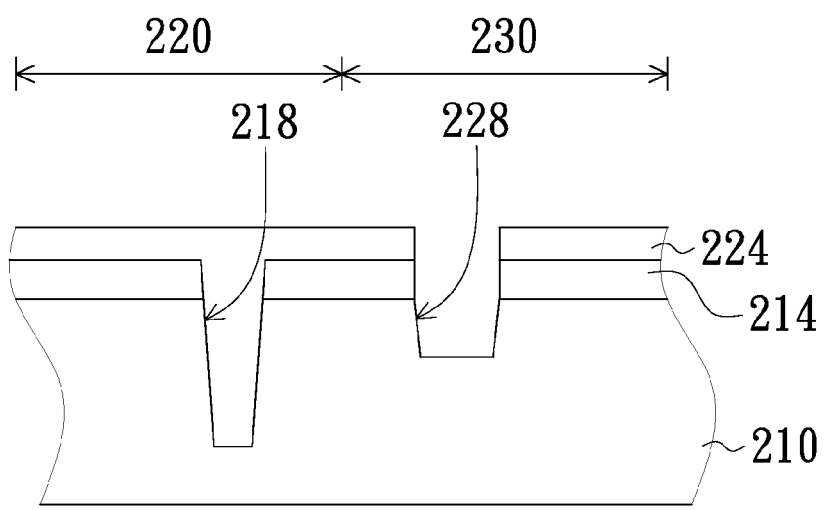
FIG. 7 is a schematic diagram illustrating a method of forming trench structures according to a second embodiment of the present invention.

Please refer to FIG. 7, which is a schematic diagram illustrating a method of forming trench structures according to a second embodiment of the present invention. In comparison with the method according to the first embodiment, the method disclosed in the second embodiment is basically the same except the order of forming trench structures.

As shown in FIG. 7, a first mask layer 214 is first formed on a semiconductor substrate 210 to define a plurality of first trench structures 218 having a first depth in the first area 220. Then, a first dielectric layer is deposited and patterned to form a second mask layer 224. After performing an etching process with the second mask layer 224 as the etching mask, a plurality of second trench structures 228 having a second depth in the second area 230 are formed.

In this embodiment, the first depth is larger than the second depth. For example, the first trench structures 218 are deep trench structures for isolating a sensing circuit in the first area 220. The second trench structures 228 are shallow trench structures for isolating a logic circuit in the second area 230.

After the formation of the first trench structures 218 and the second trench structures 228, a second dielectric layer can be formed to cover the first area 220 and the second area 230 of the semiconductor substrate 210 and filling the second trench structures 228. In addition, a CMP process can be performed for planarization.

Compared with the prior art method, the method of the present invention utilizes the first dielectric layer 122 to fill the shallow trench structures 128 and to form the second mask layer 124 for defining the deep trench structure 128. Thus, only one CMP process is required according to the method of the present invention, leading to a more simplified and efficient fabricating process. In addition, during the CMP process, a better planarization property can be achieved since the STI and DTI structures are both formed ahead of the CMP process.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming trench isolation of a semiconductor device, comprising:
   providing a semiconductor substrate formed thereon a first mask layer;
   performing a first etching process with the first mask layer as an etching mask to form a shallow trench structure;
   applying a first dielectric material to fill the shallow trench structure while forming a first dielectric layer on the semiconductor substrate as well as on the first mask layer;
   patterning the first dielectric layer to form a second mask layer;
   performing a second etching process with the second mask layer as an etching mask to form a deep trench structure; and
   applying a second dielectric material to fill the deep trench structure while forming a second dielectric layer on the semiconductor substrate as well as on the second mask layer, wherein the second dielectric layer is contacted with the second mask layer.

2. The method as claimed in claim 1 further comprising performing a chemical mechanical polishing (CMP) process for planarization.

3. The method as claimed in claim 1 wherein the shallow trench structure is formed in an area of the semiconductor substrate corresponding to a logic region and the deep trench structure is formed in another area of the semiconductor substrate corresponding to a pixel region.

4. The method as claimed in claim 3 wherein the deep trench structure is configured to isolate sensor devices in the pixel region.

5. The method as claimed in claim 1, wherein the first mask layer is a silicon nitride layer.

6. The method as claimed in claim 1, wherein the second mask layer is a silicon oxide layer.

7. The method as claimed in claim 1, wherein the shallow trench structure has a depth in a range of 2000 to 4000 angstroms.

8. The method as claimed in claim 1, wherein the deep trench structure has a depth in a range of 20000 to 40000 angstroms.

9. The method as claimed in claim 1, further comprising forming a first liner layer inside the shallow trench structure before applying the first dielectric material to fill the shallow trench structure.

10. A method of forming trench structures in a semiconductor substrate, comprising:
    providing a semiconductor substrate having a first area and a second area adjacent to the first area;
    forming a first mask layer disposed on the semiconductor substrate;
    performing a first etching process with the first mask layer to form a plurality of first trench structures having a first depth in the first area of the semiconductor substrate;
    forming a first dielectric layer on the semiconductor substrate with the first trench structures, the first dielectric layer covering the first area and the second area while filling the first trench structures as well as formed on the first mask layer;
    patterning the first dielectric layer to form a second mask layer;

performing a second etching process with the second mask layer to form a plurality of second trench structures having a second depth different from the first depth; and forming a second dielectric layer covering the first area and the second area of the semiconductor substrate and filling the second trench structures, wherein the second dielectric layer is contacted with the second mask layer.

11. The method as claimed in claim 10, wherein the first depth is larger than the second depth.

12. The method as claimed in claim 10, wherein the first depth is less than the second depth.

13. The method as claimed in claim 10, further comprising performing a chemical mechanical polishing (CMP) process for planarization.

14. The method as claimed in claim 13 wherein the first area is where logic circuit is to be formed.

15. The method as claimed in claim 13 wherein the second area is where sensing circuit is to be formed.

* * * * *